United States Patent
Yamaguchi et al.

(10) Patent No.: US 10,184,169 B2
(45) Date of Patent: Jan. 22, 2019

(54) METHOD FOR SUPPLYING DEPOSITION MATERIAL, METHOD FOR PRODUCING SUBSTRATE, CONTROL DEVICE AND DEPOSITION DEVICE

(71) Applicant: MITSUBISHI HEAVY INDUSTRIES, LTD., Tokyo (JP)

(72) Inventors: Ryuta Yamaguchi, Tokyo (JP); Tetsuya Goto, Tokyo (JP); Nobuyuki Shigeoka, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 470 days.

(21) Appl. No.: 14/419,840

(22) PCT Filed: Oct. 19, 2012

(86) PCT No.: PCT/JP2012/077105
§ 371 (c)(1),
(2) Date: Feb. 5, 2015

(87) PCT Pub. No.: WO2014/061150
PCT Pub. Date: Apr. 24, 2014

(65) Prior Publication Data
US 2015/0203958 A1 Jul. 23, 2015

(51) Int. Cl.
*C23C 14/24* (2006.01)
*C23C 14/54* (2006.01)

(52) U.S. Cl.
CPC ........... *C23C 14/246* (2013.01); *C23C 14/24* (2013.01); *C23C 14/243* (2013.01); *C23C 14/543* (2013.01)

(58) Field of Classification Search
CPC ..... C23C 14/243; C23C 14/246; C23C 14/30; C23C 14/543
(Continued)

(56) References Cited

U.S. PATENT DOCUMENTS 3,667,421 A * 6/1972 Bala .................... G01B 11/0683
118/694
4,406,252 A * 9/1983 Jones .................... C23C 14/246
118/723 EB (Continued)

FOREIGN PATENT DOCUMENTS

JP 02-122068 A 5/1990
JP 03-068760 A 3/1991
(Continued)

OTHER PUBLICATIONS

Office Action in KR Application No. 10-2015-7003614, dated Dec. 18, 2015.
(Continued)

*Primary Examiner* — Elizabeth A Burkhart
(74) *Attorney, Agent, or Firm* — Kanesaka Berner and Partners LLP

(57) ABSTRACT

Provided is a method for supplying a deposition material including a heating step of heating and evaporating a deposition material accommodated in a material accommodating section in which the deposition material is accommodated, a supply step of supplying the deposition material into the material accommodating section by feeding and melting a deposition material in a solid phase toward the melted deposition material in the material accommodating section, and a melted state detection step of detecting a melted state of the deposition material in the solid phase after supply in the supply step.

10 Claims, 17 Drawing Sheets

(58) Field of Classification Search
USPC .............................................. 118/726; 427/8
See application file for complete search history.

(56) References Cited

U.S. PATENT DOCUMENTS

| | | | | |
|---|---|---|---|---|
| 5,098,742 | A * | 3/1992 | Inoue | C23C 14/246 427/248.1 |
| 6,676,990 | B1 * | 1/2004 | Hatwar | C23C 14/14 118/726 |
| 2007/0141233 | A1 * | 6/2007 | Schlichting | C23C 14/246 427/8 |

FOREIGN PATENT DOCUMENTS

| | | |
|---|---|---|
| JP | 07-42575 A | 2/1995 |
| JP | 7-42575 B2 | 5/1995 |
| JP | 7-286266 A | 10/1995 |
| JP | 2718775 B2 | 2/1998 |
| JP | 10-154329 A | 6/1998 |
| JP | 2000-54127 A | 2/2000 |
| JP | 2002-235167 A | 8/2002 |
| JP | 3580505 B2 | 10/2004 |
| JP | 2007-23319 A | 2/2007 |
| JP | 2008-050630 A | 3/2008 |
| JP | 2009-149968 A | 7/2009 |
| JP | 2009-256743 A | 11/2009 |
| JP | 2010-255025 A | 11/2010 |
| JP | 2013-104127 A | 5/2013 |
| KR | 10-2005-0083444 A | 8/2005 |

OTHER PUBLICATIONS

Decision to Grant a Patent in EP Application No. 12886815.5, dated Sep. 8, 2016.
Written Opinion dated Jan. 22, 2013, corresponding to PCT/JP2012/077105.
Extended European Search Report dated Jul. 3, 2015, corresponding to European patent application No. 12886815.5.
International Search Report dated Jan. 22, 2013 in International Application No. PCT/JP2012/077105 filed Oct. 19, 2012.

* cited by examiner

METHOD FOR SUPPLYING DEPOSITION MATERIAL, METHOD FOR PRODUCING SUBSTRATE, CONTROL DEVICE AND DEPOSITION DEVICE

RELATED APPLICATIONS

The present application is a National Phase of International Application Number PCT/JP2012/077105, filed Oct. 19, 2012.

FIELD OF INVENTION

The present invention relates to a method for supplying as deposition material, a method for producing a substrate, a control device and a deposition device.

BACKGROUND ART

When film formation by vacuum deposition is repeatedly performed for a long period of time, it is important to supply an evaporated material and constantly hold a height of a liquid surface.

For example, in the case in which a material is evaporated using a 270° deflection type electron beam evaporation source, since an electron beam is radiated at an inclination with respect to a liquid surface, when the material is reduced by evaporation to decrease the height of the liquid surface (an evaporation surface), the radiation position of the electron beam becomes different from a position when the liquid surface is at its original height. Accordingly, a variation in film thickness distribution may occur.

In addition, when the material is reduced by evaporation using a resistance heating type crucible and the height of the liquid surface is lowered, a positional relation between a heating portion of the crucible and the material varies, and a variation in film thickness distribution may occur.

As methods of measuring the height of the liquid surface or an amount of the material in order to maintain a constant height of the liquid surface, a method of measuring a weight of a crucible in which a material is filled (for example, Patent Literature 1), a method using an optical imaging element (for example, Patent Literature 2), and a method of floating a float on a liquid surface (for example, Patent Literature 3) are known.

CITATION LIST

Patent Literature

[Patent Literature 1] Japanese Unexamined Patent Application, First Publication No. 2002-235167
[Patent Literature 2] Japanese Patent Publication. No. H07-42575
[Patent Literature 3] Japanese Unexamined Patent Application, First Publication No. 2010-255025

SUMMARY OF INVENTION

Technical Problem

However, in the method of measuring the weight of the crucible in which the material is filled, for example, a variation in the weight due to the material being attached to the outside of the crucible is not distinguished from variation in the weight of the material in the crucible, and thus the height of the liquid surface may not be accurately checked.

In addition, in the method using the optical imaging element, when the material is attached to a window of the optical element, detection of the liquid surface may be disturbed. In addition, the method of floating the float on the liquid surface cannot be easily applied when a melted area is small. Further, in the method of floating the float on the liquid surface, the material is contaminated when the float is melted.

In consideration of the above-mentioned circumstances, an object of the present invention is directed to provide a method for supplying a deposition material, a method for producing a substrate, a control device and a deposition device that are capable of more accurately measuring the height of a liquid surface without contaminating the material even when a melted area is small.

Solution to Problem

In order to solve these problems, according to an aspect of the present invention, there is provided a method for supplying a deposition material, the method including: a heating step of heating and evaporating a deposition material in a melted state in a material accommodating section; a supply step of supplying the deposition material into the material accommodating section by feeding and melting a deposition material in a solid phase toward the deposition material in the melted state in the material accommodating section; a melted state detection step of detecting a melted state of the deposition material in the solid phase after supply in the supply step; and a liquid surface detection step of detecting a height of a liquid surface of the deposition material in the material accommodating section based on a detection result in the melted state detection step, wherein, in the supply step, the deposition material in the solid phase of an amount according to the detection result in the liquid surface detection step is fed toward the melted deposition material in the material accommodating section.

In addition, according to another aspect of the present invention, in the method for supplying the deposition material, in the supply step, the deposition material in the solid phase having the same ingredient as the deposition material in the melted state in the material accommodating section may be fed.

In addition, according to another aspect of the present invention, in the method for supplying the deposition material, the deposition material in the solid phase may be linear, in the melted state detection step, a front end position of the deposition material in the solid phase after melting in the supply step may be detected, and in the liquid surface detection step, the height of liquid surface of the deposition material in the material accommodating section may be detected based on the front end position of the deposition material in the solid phase.

In addition, according, to another aspect of the present invention, in the method for supplying the deposition material, the deposition material in the solid phase may be linear, and the method may include a volume computation step of computing a volume of the deposition material to be supplied into the material accommodating section based on the height of the liquid surface detected in the liquid surface detection step; and a length computation step of converting the volume of the deposition material to be supplied into the material accommodating section into a length of the deposition material in the solid phase, wherein, in the supply step, the deposition material in the solid phase of the length computed in the length computation step is fed into the melted deposition material in the material accommodating section.

In addition, according to another aspect of the present invention, in the method for supplying the deposition material, the deposition material in the solid phase may be linear, and in the melted state detection step, the deposition material in the solid phase discharged in the supply step may be returned, and the front end of the deposition material in the solid phase may be detected.

In addition, according to another aspect of the present invention, in the method for supplying the deposition material, the method may include as withdrawal step of withdrawing the deposition material in the solid phase to a withdrawal position deviated from a range in which the deposition material evaporated from the material accommodating section is deposited, wherein, in the melted state detection step, the melted state of the deposition material in the solid phase is detected at the withdrawal position.

In addition, according to another aspect of the present invention, in the method for supplying the deposition material, the deposition material in the solid phase may be linear, the method including a withdrawal step of withdrawing the deposition material in the solid phase to a withdrawal position deviated from a range in which the deposition material evaporated from the material accommodating section is deposited, wherein, in the melted state detection step, the front end position of the deposition material in the solid phase is detected at the withdrawal position, and in the liquid surface detection step, the height of the liquid surface is computed based on a detection result in the melted state detection step and a withdrawal amount at which the deposition material in the solid phase is withdrawn to the withdrawal position in the withdrawal step.

In addition, according to another aspect of the present invention, there is provided a method for producing a substrate using the above-mentioned method for supplying the deposition material.

In addition, according to another aspect of the present invention, there is provided a control device for controlling a deposition device configured to supply a deposition material into a material accommodating section by heating and evaporating the deposition material in a melted state while the deposition material is accommodated in the material accommodating section, and feeding and melting the deposition material in a solid phase toward the deposition material in the melted state in the material accommodating section, the control device including: a liquid surface detection unit configured to detect the height of a liquid surface of the deposition material in the material accommodating section when the deposition device feeds and melts the deposition material in the solid phase toward the deposition material in the melted state in the material accommodating section to return the remaining deposition material in the solid phase, based on a front end position of the returned deposition material in the solid phase; and a deposition material feed control unit configured to compute a volume of the deposition material to be supplied into the material accommodating section, and control the deposition device to feed the deposition material such that the deposition material in the solid phase to an extent of the computed volume is fed toward the melted deposition material in the material accommodating section, based on the detection result of the liquid surface detection unit.

In addition, according to another aspect of the present invention, there is provided a deposition device including: a material accommodating section; a heating unit configured to heat and evaporate a deposition material in a melted state while the deposition material is accommodated in the material accommodating section; a supply unit configured to supply the deposition material in the material accommodating section by feeding and melting a deposition material in a solid phase toward the deposition material in the melted state in the material accommodating section; a melted state detection unit configured to detect a melted state of the deposition material in the solid phase after the supply unit supplies the deposition material into the material accommodating section; and a liquid surface detection unit configured to detect a height of a liquid surface of the deposition material in the material accommodating section based on a detection result of the melted state detection unit, wherein the supply unit feeds the deposition material in the solid phase of an amount according to the detection result of the liquid surface detection unit toward the melted deposition material in the material accommodating section.

Advantageous Effects of Invention

According to the present invention, the height of the liquid surface can be accurately measured without contaminating the material even when the melted area is small.

DESCRIPTION OF EMBODIMENTS

Hereinafter, while the present invention will be described through embodiments of the present invention, the following embodiments are not provided to limit the present invention according to the scope of the claims. In addition, not all combinations of features described in the embodiment are necessary as solving means for the present invention.

Figure 1:
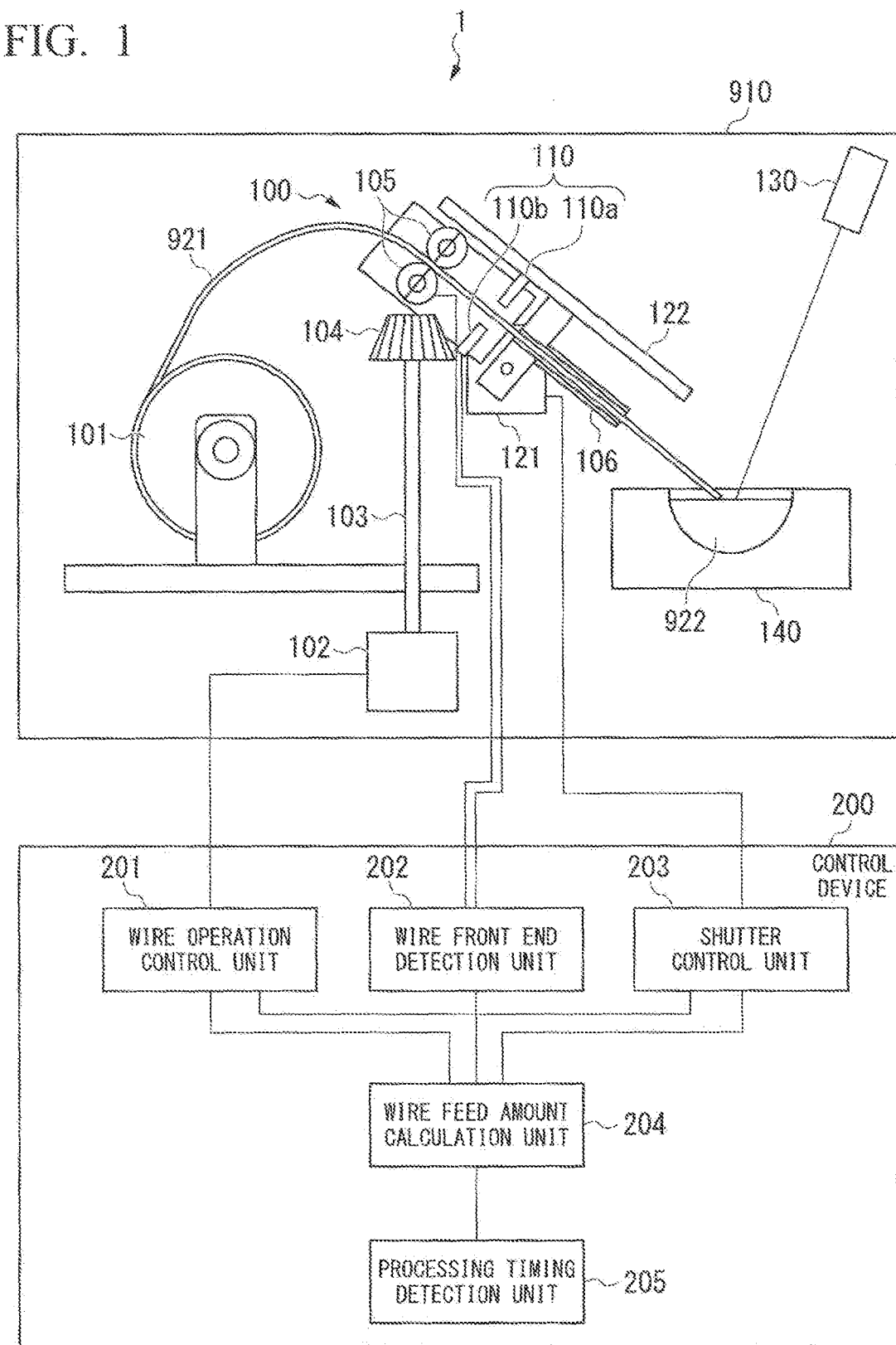
FIG. 1 is a schematic block diagram showing a functional configuration of a deposition device according to an embodiment of the present invention.

FIG. 1 is a schematic block diagram showing a functional configuration of a deposition device according to an embodiment of the present invention. In FIG. 1, a deposition device 1 includes a wire drum 101, a wire feed roller driving motor 102, a rotary shaft 103, a gear 104, a wire feed roller 105, a wire guide nozzle 106, a wire front end detection sensor 110, a shutter driving motor 121, a shutter 122, an electron beam device 130, a crucible 140 and a control device 200. The control, device 200 includes a wire operation control unit 201, a wire front end detection unit 202, a shutter control unit 203, a wire feed amount calculation unit 204 and a processing timing detection unit 205.

The deposition device 1 evaporates a deposition material and deposits the deposition material on a substance on which deposition is to be performed.

Here, the deposition material is a material evaporated to perform deposition. Hereinafter, the deposition material is simply referred to as "a material." Further, an ingredient of the material in the embodiment of the present invention is not particularly limited. For example, the material may be a metal such as aluminum or the like, or may be an oxide or a fluoride.

In addition, although the case in which the material has a wire shape will be described hereinafter, the shape of the material is not limited thereto. For example, the shape may be any shape such as a sheet shape or the like having a certain width and thickness as long as an operation of feeding a material toward the crucible 140 and an operation of returning the fed material (an operation of moving the material in a direction opposite to the feeding direction) are possible, and a melting amount can be obtained by measuring the remaining portion when the material is partially melted.

In addition, the substance on which deposition is to be performed is a substance on which the deposition material is deposited. Further, the substance on which deposition is to be performed in the embodiment of the present invention is not particularly limited. For example, the substance on which deposition is to be performed may be a substrate such as an organic electroluminescence panel or the like, or may be an optical element such as a lens or the like. Hereinafter, an exemplary example in which the substance on which deposition is to be performed is the substrate will be described.

The crucible 140 is an example of a material accommodating section, and accommodates a material.

The electron beam device 130 is an example of a heating unit, and heats the material accommodated in the crucible 140 to evaporate the material.

Processing in which the electron beam device 130 heats and evaporates the material accommodated in the crucible 140 is an example of processing in a heating step.

Here, as the electron beam device 130 heats the material accommodated in the crucible 140, the material accommodated in the crucible 140 becomes a material 922 in a melted state. Further, when a wire 921 is inserted into the melted material 922, the wire 921 is melted by heat of the melted material 922. Accordingly, as the wire 921 is inserted into the melted material 922, the material can be supplied into the crucible 140.

However, the heating unit according to the embodiment of the present invention is not limited, to the electron beam device 130 as long as the heating unit heats the crucible 140 to evaporate the material. For example, the deposition device 1 may include a resistance heater serving as the heating unit configured to heat the crucible 140.

The wire drum 101 is configured by winding the wire 921 serving as the deposition material on a cylinder serving as a core of the wire drum 101, and discharges the wire according to an operation of the wire feed roller 105.

The wire feed roller driving motor 102 rotates the wire feed roller 105 via the rotary shaft 103 and the gear 104.

The rotary shaft 103 and the gear 104 transmit a rotational force generated by the wire feed roller driving motor 102 to the wire feed roller 105.

The wire feed roller 105 is rotated by the rotational force generated by the wire feed roller driving motor 102 to operate the material. Specifically, the wire feed roller 105 discharges the material supplied from the wire drum 101 toward the crucible 140. In addition, the wire feed roller 105 returns the material discharged toward the crucible 140. The processing of returning the material is processing of withdrawing the wire 921 serving as the deposition material in a solid phase to a withdrawal position (a position deviated from a range in which the material is deposited) made by the shutter 122, the wire guide nozzle 106, or the like, which corresponds to an example of processing in a withdrawal step.

In addition, as a rotation direction and a rotation amount of the wire feed roller 105 are measured, a movement amount of the wire 921 (in particular, a movement amount of a front end of the wire 921) can be calculated.

The wire guide nozzle 106 supports the material discharged toward the crucible 140 by the wire feed roller 105 to stabilize a direction of the material to the crucible 140. In addition, in a state shown in FIG. 1, the wire guide nozzle 106 defines a moving direction of the wire 921, and narrows a space passing from the crucible 140 to the wire front end detection sensor 110. Accordingly, movement of the material evaporated in the crucible 140 to the wire front end detection sensor 110 can be suppressed. Accordingly, deposition of the material to the wire front end detection sensor 110 can be suppressed.

Here, as the wire drum 101, the wire feed roller driving motor 102, the rotary shaft 103, the gear 104, the wire feed roller 105 and the wire guide nozzle 106 constitute a supply unit 100, and the wire 921 serving as a solid phase material is fed and melted toward the melted material 922 in the crucible 140, the material is supplied into the crucible 140. The processing in which the supply unit 100 feeds and melts the solid phase material toward the melted material 922 in the crucible 140 is an example of the processing in a supply step. More specifically, the supply unit 100 supplies the material by moving the wire 921 serving as the solid phase material having a wire shape toward the crucible 140.

However, the supply unit according to the embodiment of the present invention is not limited to the wire drum 101, the wire feed roller driving motor 102, the rotary shaft 103, the gear 104, the wire feed roller 105 and the wire guide nozzle 106, but may be possible as long as the material (for example, the wire 921) can be fed toward the crucible 140 or can return the fed material.

Further, in FIG. 1, for the convenience of illustration, while only the pair of the wire feed rollers 105 are shown as the roller, the deposition device 1 includes a plurality of rollers configured to stably perform an operation of feeding the wire 921 toward the crucible 140 and an operation of returning the fed wire 921.

The wire front end detection sensor 110 is an example of the melted state detection unit, and detects a melted state of the solid phase material after the supply unit 100 supplies the material into the crucible 140. The processing in which the wire front end detection sensor 110 detects the melted state of the solid phase material after the supply unit 100 supplies the material into the crucible 140 is an example of processing in a melted state detection step.

More specifically, the wire front end detection sensor 110 detects a front end position of the wire 921 serving as the solid phase material. Hereinafter, the case in which the wire front end detection sensor 110 includes a light source 110a configured to output light, and an optical sensor 110b configured to detect the light from the light source will be exemplarily described. When the wire 921 passes between the light source 110a and the optical sensor 110b, the light output from the light source 110a is blocked by the wire 921, and the optical sensor 110b cannot detect the light. The wire front end detection sensor 110 detects whether a front end of the wire 921 at the timing is disposed between the light source 110a and the optical sensor 110b (hereinafter referred to as "a position of the wire front end detection sensor 110") through switching of detection/non-detection of the light in the optical sensor 110b.

However, a configuration of the wire front end detection sensor 110 is not limited to the configuration including the light source 110a and the optical sensor 110b. For example, the wire front end detection sensor 110 includes a switch pushed down by the wire 921, and may be configured to detect whether the front end of the wire 921 is at a position at which the switch is installed at the timing through the ON/OFF switching of the switch.

In addition, neither an attachment position nor a direction of the wire front end detection sensor 110 is limited to that shown in FIG. 1, and a position of the front end of the wire 921 may be detectable. For example, the wire front end detection sensor 110 may be attached in the horizontal direction.

As the shutter 122 serving as an example of a suppression unit is disposed between the crucible 140 and the wire front end detection sensor 110 in a closed state of the shutter 122 (a closed state), deposition of the material heated and evaporated by the electron beam device 130 to the wire front end detection sensor 110 is suppressed.

Here, in FIG. 1, an open state of the shutter 122 (an open state) is shown. In the open state of the shutter 122, when the front end of the wire 921 is returned to a side closer to the wire drum 101 than the wire guide nozzle 106, the material evaporated in the crucible 140 can pass through a hole of the wire guide nozzle 106 to arrive at the wire front end detection sensor 110. However, as described above, as the wire guide nozzle 106 narrows the space passing from the crucible 140 to the wire front end detection sensor 110, deposition of the material on the wire front end detection sensor 110 can be suppressed.

Figure 2:
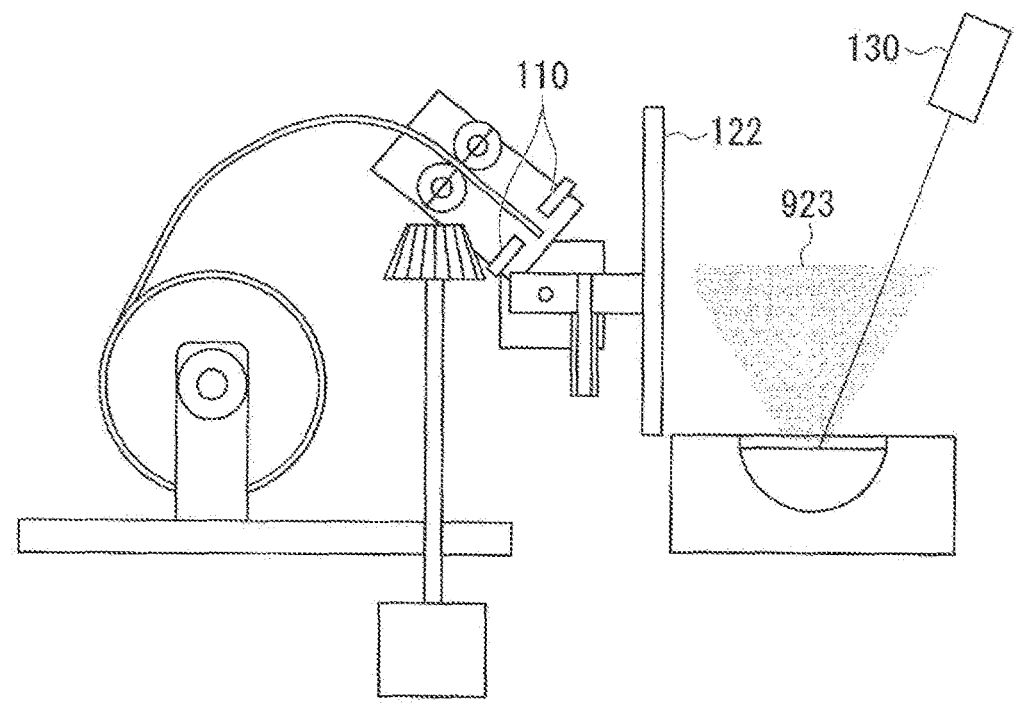
FIG. 2 is a view showing a closed state of a shutter 122 according to the embodiment.

Meanwhile, FIG. 2 is a view showing the closed state of the shutter 122.

In the state of FIG. 2, as the shutter 122 is disposed between the crucible 140 and the wire front end detection sensor 110, movement of the material heated and evaporated by the electron beam device 130 to the wire front end detection sensor 110 is suppressed.

The shutter driving motor 121 serving as a stepping motor opens/closes the shutter 122 by varying an angle of the shutter 122. The processing in which the shutter driving motor 121 operates the shutter 122 is an example of a suppression step.

Further, the method of operating the suppression unit in the embodiment of the present invention is not limited to the method of using the stepping motor. For example, the shutter 122 is configured to close due to the weight thereof, and the shutter 122 may be configured to open as the shutter driving motor 121 applies a rotational force to the shutter 122.

The control device 200 controls an operation of the wire 921 or an operation of the shutter 127. Here, the control device 200 may be realized in various shapes. For example, the control device 200 may be realized by a computer, and the respective parts of the control device 200 may be performed as the computer executes programs. Alternatively, the respective parts of the control device 200 may be realized by a hardware circuit.

The wire operation control unit 201 controls an operation of the wire 921 by controlling the wire feed roller driving motor 102.

The wire front end detection unit 202 detects a timing at which the front end of the wire 921 is disposed at a position of the wire front end detection sensor 110 based on a detection result of the light in the wire front end detection sensor 110. In addition, the wire front end detection unit 202 calculates a movement amount of the front end of the wire 921 based on a rotation amount of the wire feed roller 105 from the timing at which the front end of the wire 921 is disposed at the position of the wire front end detection sensor 110. Accordingly, the wire front end detection unit 202 detects the position of the front end of the wire 921 using the position of the wire front end detection sensor 110 as a standard (an origin).

The shutter control unit 203 controls opening/closing of the shutter 122 by controlling the shutter driving motor 121.

The wire feed amount calculation unit 204 detects a height of the liquid surface of the material in the crucible 140 based on the detection result of the wire front end detection unit 202, and calculates a discharge amount of the wire 921 to supply the material into the crucible 140 based on the height of the liquid surface. The wire feed amount calculation unit 204 is an example of the liquid surface detection unit according to the present invention. In addition, the processing in which the wire feed amount calculation unit 204 detects the height of the liquid surface of the material in the crucible 140 based on the detection result of the wire front end detection unit 202 is an example of processing in a liquid surface detection step.

The processing timing detection unit 205 detects the timing at which the deposition device 1 performs the processing of supplying the material into the crucible 140 (hereinafter referred to as "material supply processing"). The timing of the material supply processing will be described below.

Further, the wire drum 101, the wire feed roller driving motor 102, the rotary shaft 103, the gear 104, the wire feed roller 105, the wire guide nozzle 106, the wire front end detection sensor 110, the shutter driving motor 121, the shutter 122, the electron beam device 130 and the crucible 140 are installed in a vacuum case 910. Here, the inside of the vacuum case 910 is exhausted to substantially a vacuum state to uniformize a thickness of a formed film.

Further, the deposition device 1 includes a belt conveyor, which is not shown, configured to move a substrate serving as a substance on which deposition is to be performed and cause the substrate to pass through the atmosphere in which the material is evaporated.

In addition, as described below, the deposition device 1 further includes a sensor configured to detect a position of the base serving as the substance on which deposition is to be performed.

Next, the operations of the wire 921 and the shutter 122 will be described with reference to FIG. 3.

Figure 3:
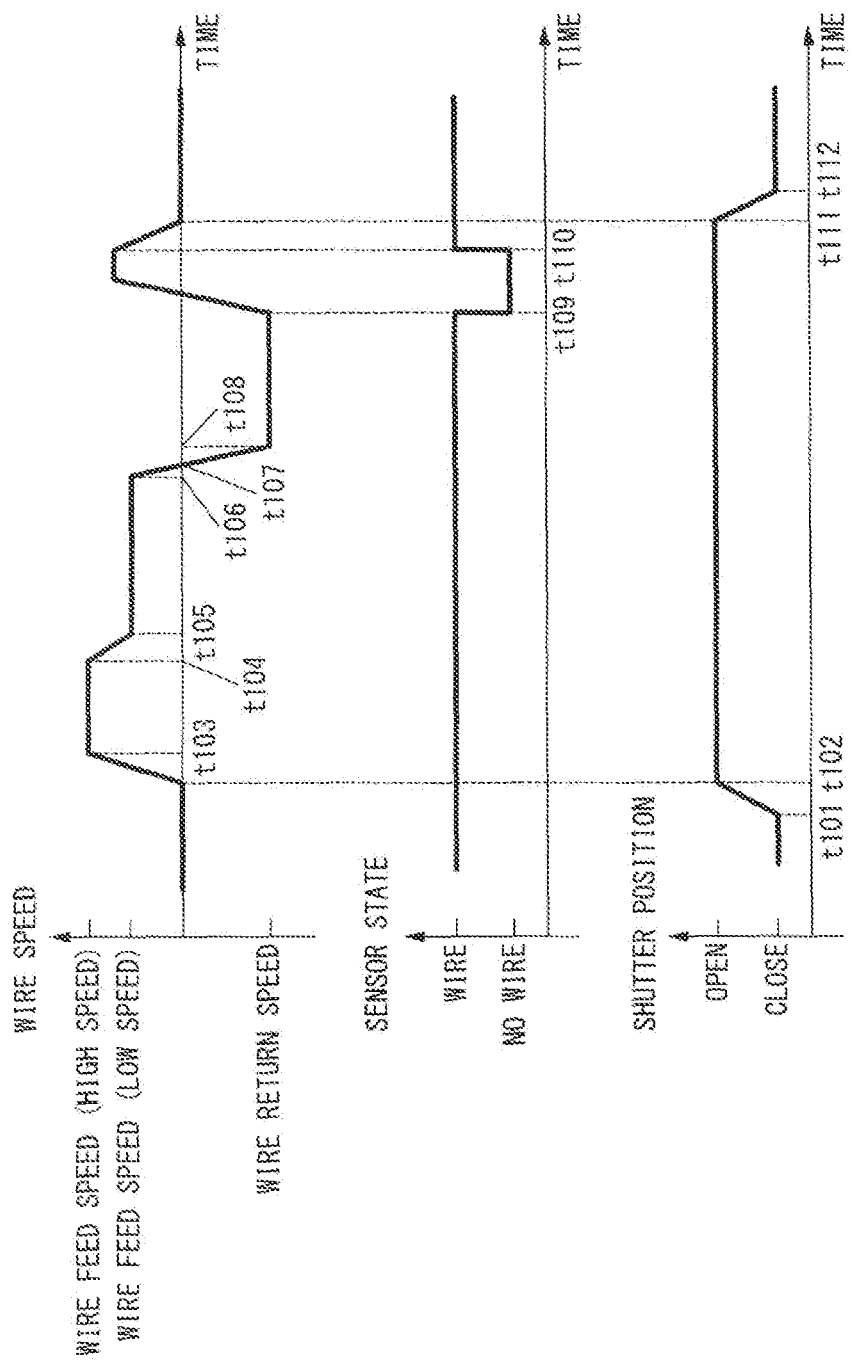
FIG. 3 is a view showing an example of a state (a wire detection state) of an operation of a wire 921 and a wire front end detection sensor 110 in one instance of material supply processing in the embodiment, and a position of the shutter 122.

FIG. 3 is a view showing an example of a state of an operation of the wire 921 and the wire front end detection sensor 110 (a wire detection circumstance), and a position of the shutter 122 in one instance of the material supply processing in the embodiment When the material supply processing starts, at a time t101, the shutter control unit. 203 controls the shutter driving motor 121 to open the shutter 122. At a time t102, when the shutter 122 is opened, the wire operation control unit 201 controls the wire feed roller driving motor 102 to perform a feed operation of the wire 921.

Here, the wire operation control unit 201 properly uses a two-stage speed as a speed at which to feed the wire 921. First, the front end of the wire 921 is disposed in the vicinity of the wire front end detection sensor 110 at the time t102. Here, the wire operation control unit 201 controls the wire feed roller driving motor 102 while the front end of the wire 921 approaches the vicinity of the crucible 140 until a time t104, and performs a high speed feed operation in which the wire 921 is fed at a high speed. Further, from the time t102 to a time t103, the site operation control unit 201 performs start-up until the wire 921 is fed at the high speed. As the wire operation control unit 201 feeds the wire 921 at the high speed, the deposition device 1 can terminate the material supply processing more rapidly. The wire operation control unit 201 feeds the wire 921 at the high speed, for example, until the front end of the wire 921 arrives at a standard liquid surface position. Here, the standard liquid surface position is a target position of the liquid surface of the melted material 922 in the crucible 140 (hereinafter referred to as "a liquid surface in the crucible 140").

Meanwhile, when the front end of the wire 921 approaches the crucible 140, the wire operation control unit 201 controls the wire feed roller driving motor 102 to perform a low speed feed operation of feeding the wire 921 at a low speed. In an example of FIG. 3, from a time t105 to a time t106, the wire operation control unit 201 feeds the wire 921 at the low speed. As the wire 921 is fed at the low speed, the wire 921 entering the melted material 922 in the crucible 140 can be more securely melted.

At a time t107, a feed amount of the wire 921 arrives at a feed amount set by the wire feed amount calculation unit 204, and the wire operation control unit 201 controls the wire feed roller driving motor 102 to perform an operation of returning the wire 921 toward the wire drum 101. The wire operation control unit 201 performs, for example, a turning operation at the same wire speed as in the high speed feed operation.

According to the returning operation, at a time t109, the front end of the wire 921 passes the position of the wire front end detection sensor 110, and the wire front end detection sensor 110 is switched to a state in which the wire 921 is not detected. Here, the wire operation control unit 201 terminates the returning operation of the wire 921, and feeds the wire 921 again. According to the feed operation, at a tune t110, the front end of the wire 921 passes the position of the wire front end detection sensor 110, and the wire front end detection sensor 110 is switched to a state in which the wire 921 is detected. Here, the wire operation control unit 201 terminates the feed of the wire 921, and the wire 921 is stopped at a time t111. The shutter control unit 203 receives stoppage of the wire 921 and controls the shatter driving motor 121 to close the shutter 122, and the shutter 122 is closed at a time t112. After that, the deposition device 1 terminates the one instance of material supply processing. In this way, the shutter control unit 203 keeps the shutter 122 in the closed state except during the material supply processing.

Next, calculation of a wire feed amount performed by the wire feed amount calculation unit 204 will be described with reference to FIGS. 4 and 5.

Figure 4:
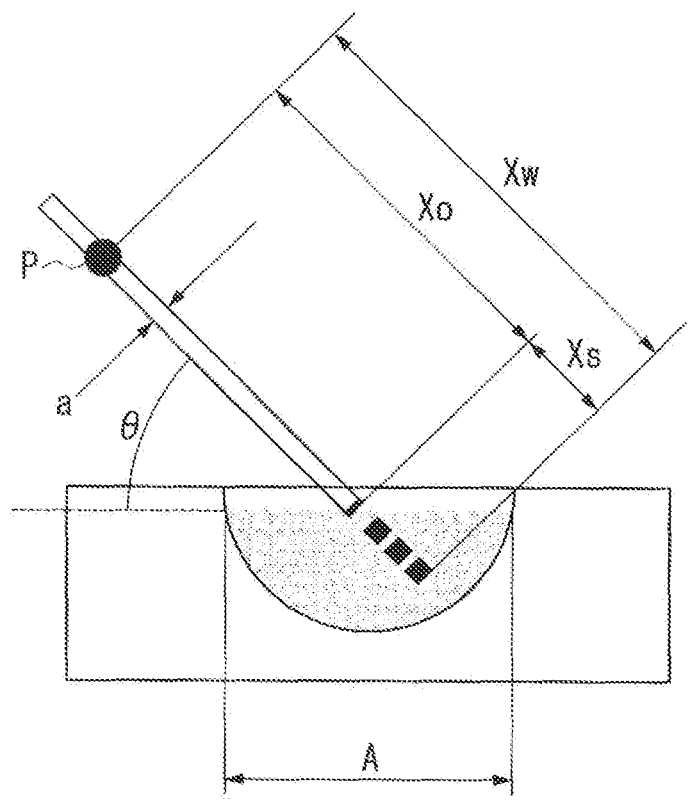
FIG. 4 is a view showing an example of a return amount of a wire when a liquid surface in a crucible 140 of the embodiment is disposed at a standard liquid surface position.

FIG. 4 is a view showing an example of a return amount of the wire when the liquid surface in the crucible 140 is disposed at the standard liquid surface position.

In FIG. 4, a total wire feed amount Xw represents a distance that the wire feed roller 105 feeds the wire 921 toward the crucible 140 using a position P of the wire front end detection sensor 110 as a standard. The total wire feed amount Xw is obtained by adding a liquid surface standard distance Xo and a wire length Xs to an extent of a standard material consumption amount.

The liquid surface standard distance Xo represents a distance from the position of the wire from end detection sensor 110 to the standard liquid surface. As described above, the standard liquid surface is a target position of the liquid surface in the crucible 140, and thus the liquid surface standard distance Xo is previously set as a design value by a user.

The wire length Xs to the extent of the standard material consumption amount is a wire length to an extent of the material consumed (evaporated) from the material supply processing to the next material supply processing. The wire length Xs to the extent of the standard material consumption amount is a value obtained by multiplying a supply interval time (a time from the material supply processing to the next material supply processing) by a consumption amount (an evaporation amount) of the material per unit time.

When the liquid surface in the crucible 140 is disposed at the standard liquid surface position, in the total wire feed amount Xw, an extent of the wire length Xs to the extent of the standard material consumption amount is inserted into the melted material 922 in the crucible 140 and melted. Accordingly, the return amount of the wire 921 becomes the liquid surface standard distance Xo. The return amount described herein is a moving distance until the front end of the wire 921 arrives at the position P of the wire front end detection sensor 110 in the return operation of the wire 921.

Further, hereinafter, the case in which a portion of the wire 921 inserted into the melted material 922 in the crucible 140 is melted will be described. In the case in which the wire 921 is relatively hard to melt and the melting portion of the wire 921 is lower than the liquid surface, or the case in which the wire 921 is relatively easily melted and the wire 921 is melted above the liquid surface, correction is considered to be performed according to a difference from the position of the liquid surface.

Further, a diameter A of a melting range in the crucible 140 shown in FIG. 4 is used to obtain a capacity of an insufficient amount of the material from the height of the liquid surface. Here, the diameter of the melting range in the crucible 140 is a diameter of the liquid surface in the crucible 140. As the deposition device 1 supplies the material before the liquid surface is largely lowered from the standard liquid surface position, the diameter at the standard liquid surface position can be used as the diameter of the melting range in the crucible 140. Further, the diameter at the standard liquid surface position is previously set as a design value by a user.

In addition, the diameter A of the wire 921 is used to convert the capacity of the material into the wire length. In addition, an angle θ is used to convert the wire length into the height of the liquid surface. The diameter A or the angle θ of the wire 921 is also previously set as a design value by a user.

Figure 5:
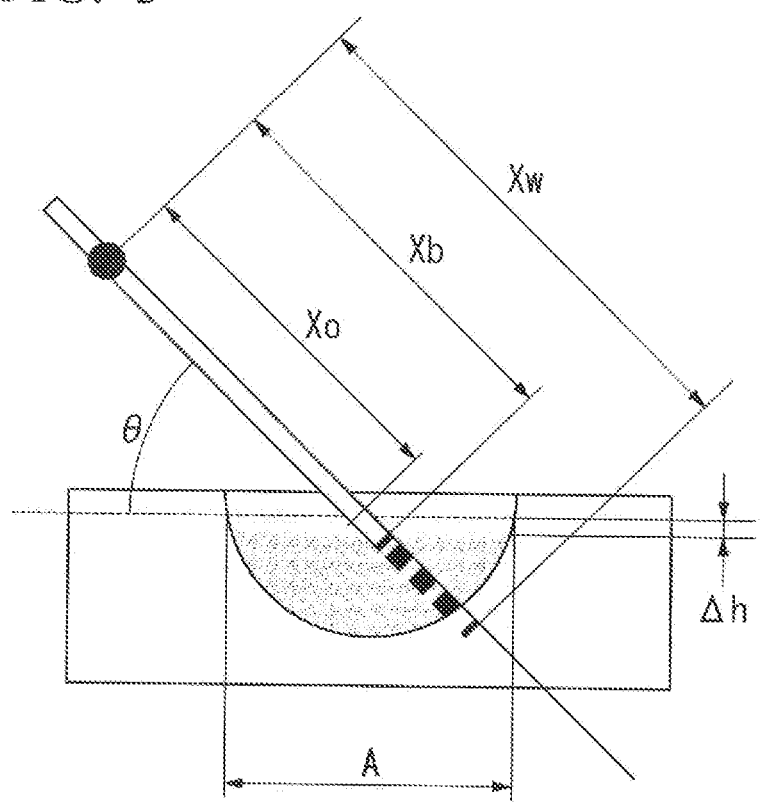
FIG. 5 is a view showing an example of a return amount of the wire when a position of the liquid surface in the crucible 140 of the embodiment is different from the standard liquid surface position.

FIG. 5 is a view showing an example of the return amount of the wire when the position of the liquid surface in the crucible 140 is different from the standard liquid surface position. Unlike the case of FIG. 4, in FIG. 5, the position of the liquid surface is varied from the standard liquid surface position. According to variation in a position of the liquid surface, a return amount Xb and the liquid surface standard distance Xo are different from each other. Here, the wire feed amount calculation unit 204 calculates a difference Δh of the height of the liquid surface with respect to the standard liquid surface position based on Equation (1).

[Math. 1]

$$\Delta h = \sin\theta \times (Xo - Xb) \quad (1)$$

Next, the wire feed amount calculation unit 204 calculates an amount Ms to be corrected with respect to an amount (a volume) of the melted material 922 in the crucible 140 based on Equation (2).

[Math. 2]

$$Ms = \left(\frac{A}{2}\right)^2 \times \pi \times \Delta h \quad (2)$$

The processing in which the wire feed amount calculation unit 204 calculates the amount to be corrected with respect to the amount (a volume) of the melted material 922 in the crucible 140 is an example of processing m a volume computation step.

Next, the wire feed amount calculation unit 204 converts the amount Ms to be corrected into a wire length ΔXt based on Equation (3).

[Math. 3]

$$\Delta Xt = \frac{Ms}{\left(\frac{a}{2}\right)^2 \times \pi} \quad (3)$$

Further, the wire feed amount calculation unit 204 corrects the wire length Xs to the extent of the standard material consumption amount based on Equation (4), and calculates a wire length Xa to be supplied into the crucible 140 (i.e. a wire length to an extent to be melted).

[Math. 4]

$$Xa = Xs - \Delta Xt \quad (4)$$

The processing in which the wire feed amount calculation unit 204 calculates the wire length to be supplied into the crucible 140 is an example of processing in a length computation step.

After that, the wire feed amount calculation unit 204 calculates the total wire feed amount Xw in the next material supply processing based on Equation (5).

[Math. 5]

$$Xw = Xo + Xa \quad (5)$$

Figure 6:
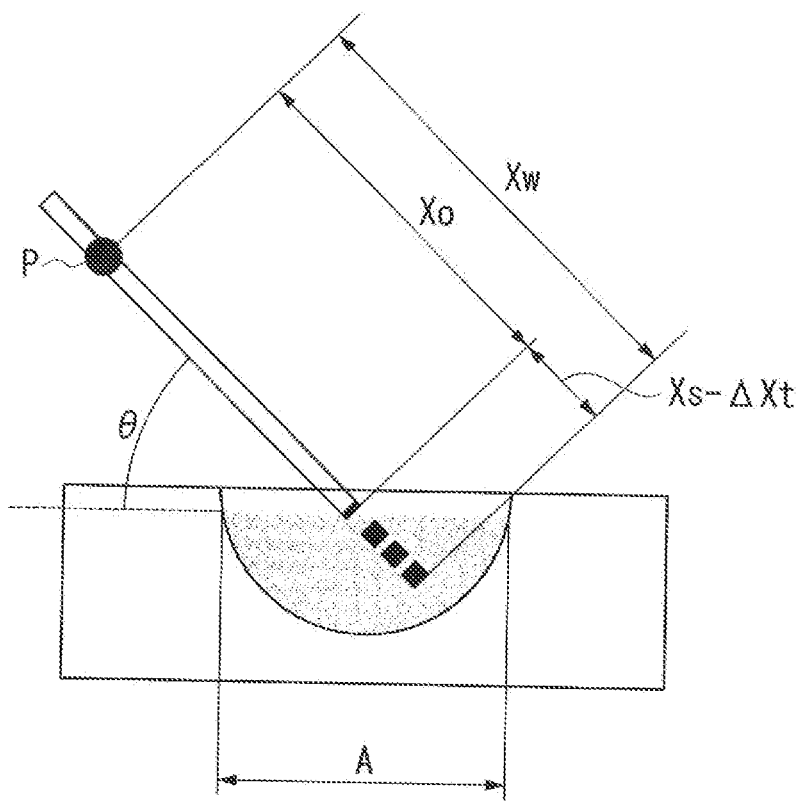
FIG. 6 is a view showing at example of a feed amount in the next material supply processing of the embodiment.

FIG. 6 is a view showing an example of a feed amount in the next material supply processing. As shown in FIG. 6, the feed amount is corrected to an extent of the wire length ΔXt of a correction value obtained by Equation (3). Here, when the liquid surface is lowered from the standard liquid surface position as described u the example of FIG. 5, a value of the wire length ΔXt of the correction value by Equation (3) may be negative. Accordingly, the total wire feed amount Xw is increased more than when the liquid surface is disposed at the standard liquid surface position as described in the example of FIG. 4.

Next, a start timing, of the material supply processing detected by the processing timing detection unit 205 will be described with reference to FIGS. 7 to 10.

Figure 7:
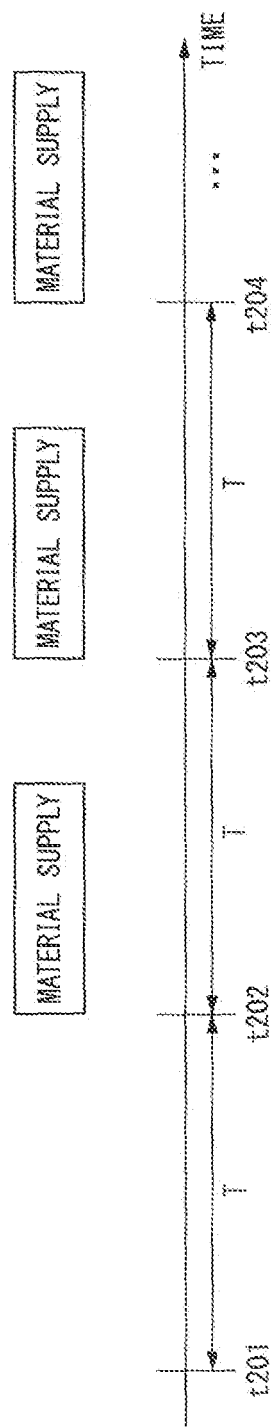
FIG. 7 is a view showing a first example of a start timing of the material supply processing detected by a processing timing detection unit 205 in the embodiment.

FIG. 7 is a view showing a first example of the start, timing of the material supply processing detected by the processing timing detection unit 205. In FIG. 7, an example of the start timing of the material supply processing when the start timing detection method of the material supply processing is set to a regular material supply method is shown.

In the regular material supply method, the deposition device 1 performs the material supply processing, at every constant time. In the example of FIG. 7, when an automatic operation of the deposition device 1 is started at a time t201, the processing timing detection unit 205 detects the start timing of the material supply processing at every preset supply period T such as times t202, t203 and t204, and the deposition device 1 performs the material supply processing based thereon. The processing timing detection unit 205 has, for example, a timer, and detects the start timing of the material supply processing by measuring the supply period T.

In the regular material supply method, since the deposition device 1 supplies the material at every constant time, a material consumption amount (an evaporation amount) is expected to be constant each time the material supply processing is performed. Accordingly, the material supply amount may be constant, and the height of the liquid surface of the crucible 140 is easy to control to be constant. In addition, in the regular material supply method, since the material is supplied at every constant time, effectiveness of the regular displacement correction using an average value (to be described below) is expected to be high.

Further, in the case of the regular material supply method, the wire feed amount calculation unit 204 computes a standard material consumption amount Xs (the length of the wire 921 to be melted in one instance of the material supply processing when the position of the liquid surface of the crucible 140 is disposed at the standard liquid surface position as described in the example of FIG. 4) based on Equation (6).

[Math. 6]

$$Xs = T \times G \quad (6)$$

Here, T represents a supply period (for example, unit: minutes). In addition, G represents a material consumption amount (a length obtained by converting a material capacity consumed per unit time into a wire length, for example, unit: millimeters per minute (mm/min)). In addition, Xs represents a standard material consumption amount (in, for examples, millimeters (mm)).

Figure 8:
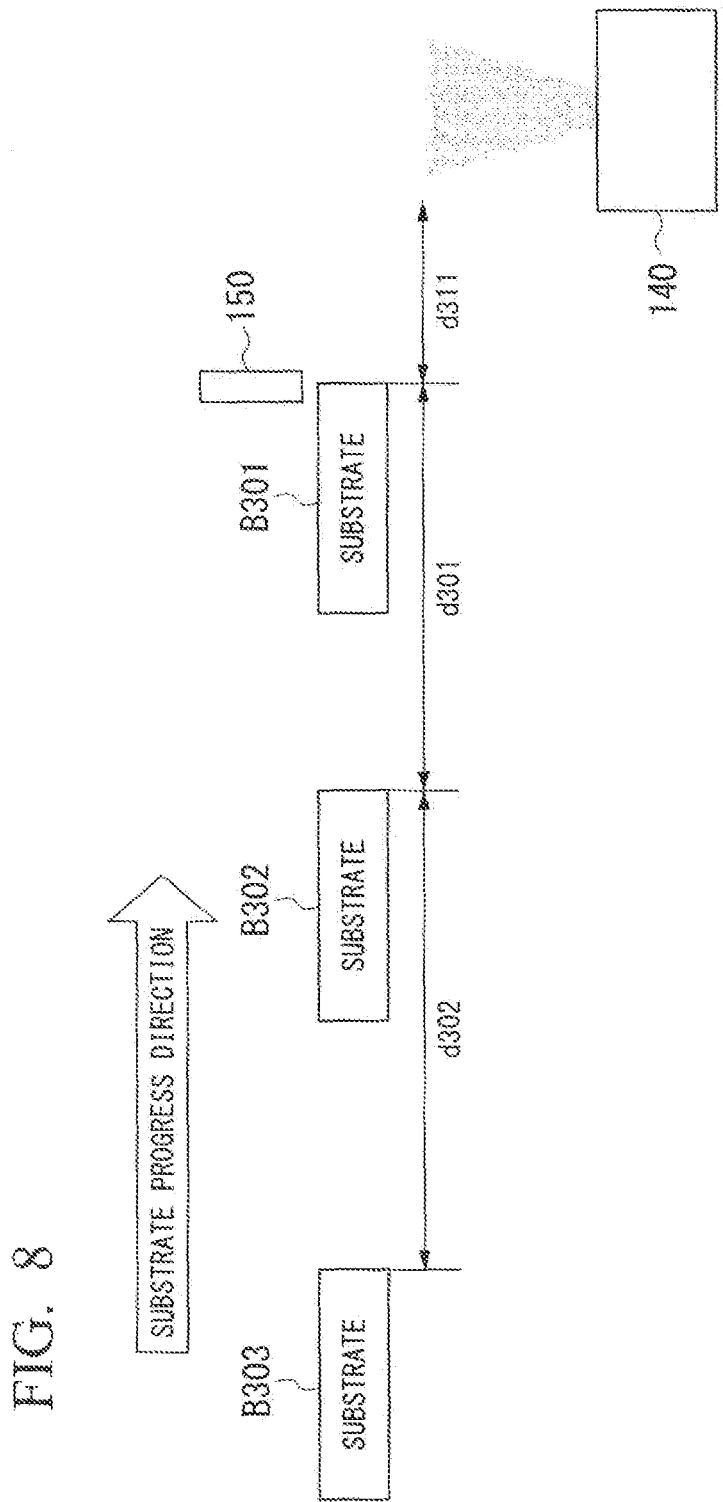
FIG. 8 is a view showing an example of a position of a substrate in the embodiment.

FIG. 8 is a view showing an example of a position of a substrate serving as a substance on which deposition is to be performed. In a conveyance substrate interval material supply method serving as another detection method of the start timing of the material supply processing, the material supply processing is performed before the substrate arrives at a deposition region (atmosphere in which the material is evaporated). For this reason, at a position of a distance d311 at which one instance of the material supply processing is performable before the substrate arrives at the deposition region, when a substrate detection sensor 150 detects the substrate, the deposition device 1 performs the material supply processing. Here, the processing timing detection unit 205 detects the detected timing as the start timing of the material supply processing, when the substrate detection sensor 150 detects the substrate.

Figure 9:
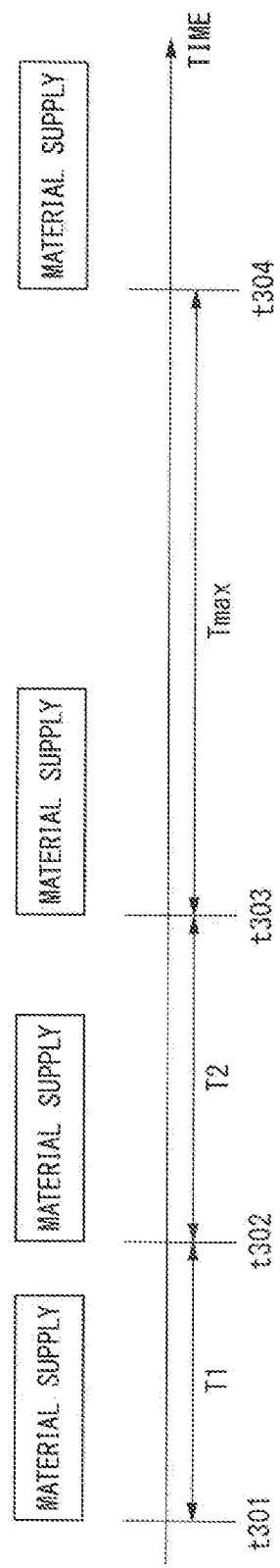
FIG. 9 is a view showing a second example of the start timing of the material supply processing detected by the processing timing detection unit 205 in the embodiment.

FIG. 9 is a view showing as second example of the start timing of the material supply processing detected by the processing timing detection unit 205.

In the example of FIG. 9, the processing timing detection unit 205 detects the start timing of the material supply processing at times t301, t302 and t303 at which the substrate detection sensor 150 detects substrates B301, B302 and B303 in the example of FIG. 8.

In addition, in the conveyance substrate interval material supply method, in order to prevent the liquid surface in the crucible 140 from being excessively decreased, the material supply processing may be performed even when the substrate is not conveyed for a predetermined time or more. In the example of FIG. 9, at a time t304 at which a supply period limit time Tmax elapses from the time t303, while the substrate detection sensor 150 does not detect the substrate, the processing timing detection unit 205 detects the time t304 as the start timing of the material supply processing. Here, the supply period limit time Tmax is a preset time serving as an upper limit of the time from the material supply processing to the next material supply processing.

Figure 10:
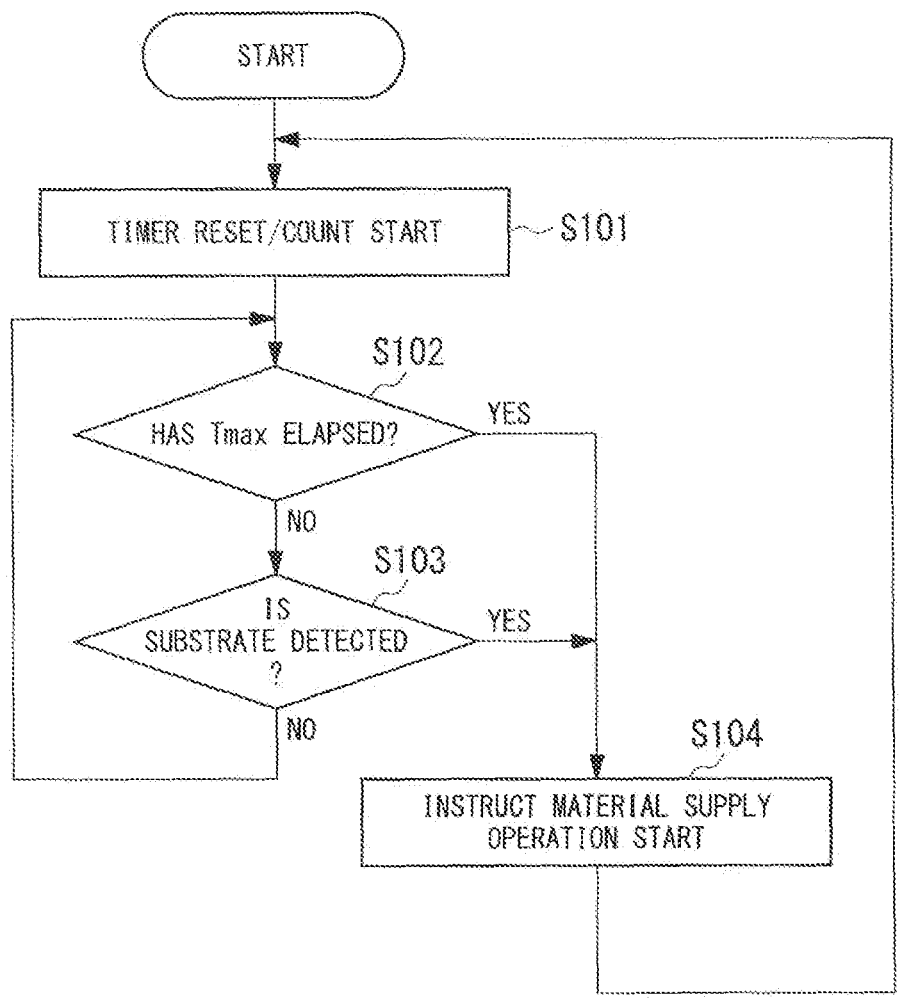
FIG. 10 is a view showing an example of a processing procedure in which the processing timing detection unit 205 detects a start timing of the material supply processing in a conveyance substrate interval material supply method of the embodiment.

FIG. 10 is a view showing an example of a processing procedure in which the processing timing detection unit 205 detects the start timing of the material supply processing in the conveyance substrate interval material supply method.

In the processing of FIG. 10, first, the processing timing detection unit 205 resets a timer thereof to start counting time (step S101).

Next, the processing timing detection unit 205 determines whether the timer count number arrives at the supply period limit time Tmax (step S102). When arrival at the supply period limit time Tmax is determined (step S102: YES), the processing timing detection unit 205 instructs start of the material supply operation with respect to the wire feed amount calculation unit 204 (step S104). After that, the process returns to step S101.

Meanwhile, in step S102, when non-arrival at the supply period limit time Tmax is determined (step S102; NO), the processing timing detection unit 205 determines whether the substrate detection sensor 150 detects the substrate (step S103). When it is determined that the substrate is detected (step S103: YES), step S104 is performed. Meanwhile, when it is determined that the substrate is not detected (step S103: NO), the process returns to step S101.

In this way, the processing timing detection unit 205 detects both of the timing at which the supply period limit time Tmax elapses and the timing at which the substrate detection sensor 150 detects the substrate as the start timing of the material supply processing.

In the conveyance substrate interval material supply method, before the substrate arrives at the deposition region, the deposition device 1 performs the material supply processing to uniformize the height of the liquid surface of the crucible 140. Accordingly, a film pressure is expected to become constant. In addition, since the material supply processing is not performed during film formation with respect to the substrate, a variation in rate due to a variation in temperature in the crucible 140 does not occur.

Further, in the case of the conveyance substrate interval material supply method, the wire feed amount calculation unit 204 computes the standard material consumption amount Xs based on Equation (7).

[Math. 7]

$$Xs = Ti \times G \quad (7)$$

Here, Ti represents a supply period (for example, unit: minutes). In the case of the conveyance substrate interval material supply method, the supply period Ti can vary. When the supply period Ti arrives at the supply period limit time Tmax (for example, unit: minutes), Equation (7) becomes similar to Equation (8).

[Math. 8]

$$Xs = T_{max} \times G \quad (8)$$

Next, an operation of the deposition device 1 will be described with reference to FIGS. 11 to 17.

Figure 11:
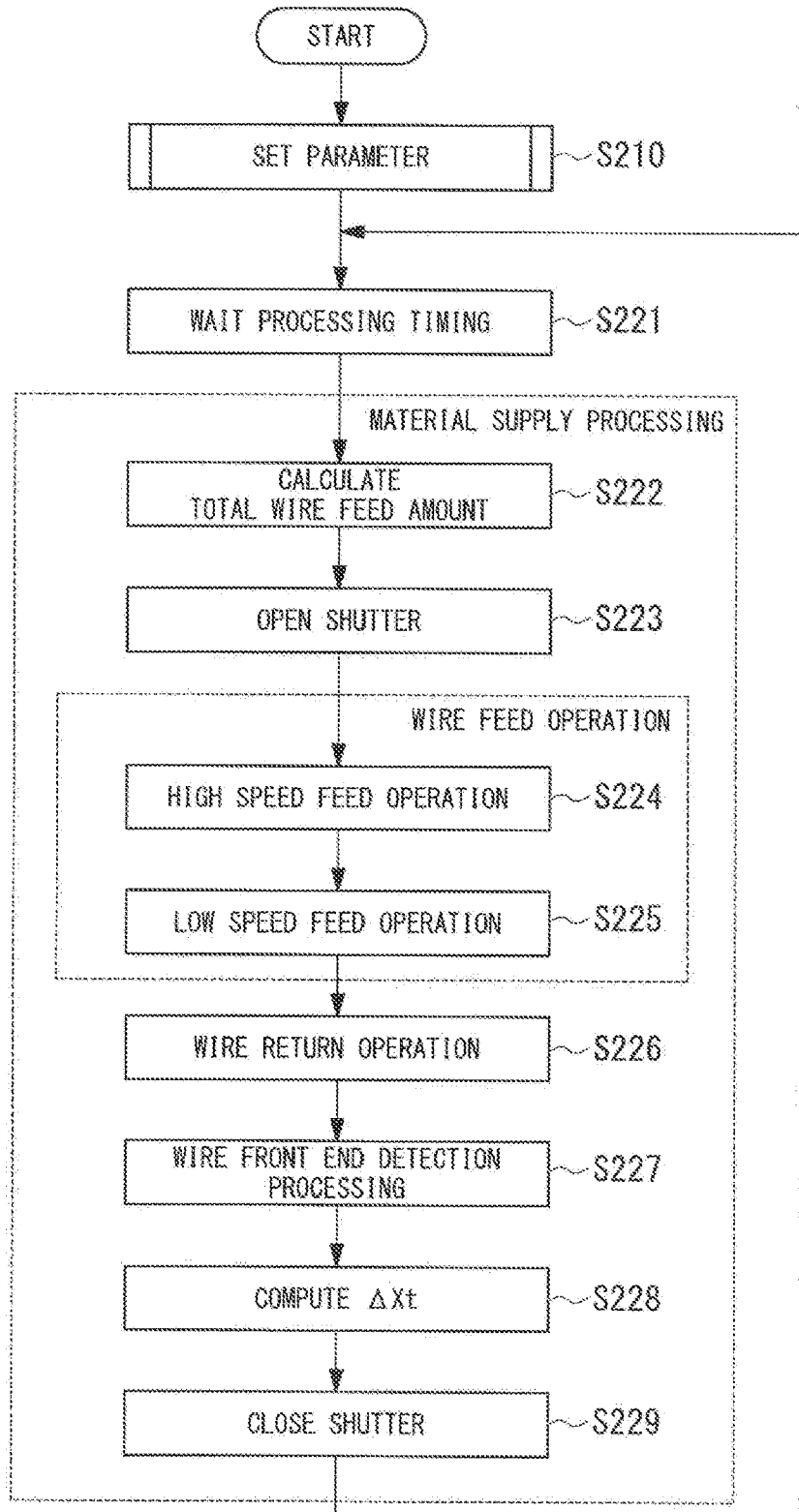
FIG. 11 is a view schematically showing the material supply processing performed by a deposition device 1 in the embodiment.

FIG. 11 is a view schematically showing the material supply processing performed by the deposition device 1.

In the processing of FIG. 11, first, the wire feed amount calculation unit 204 and the processing timing detection unit 205 receive user settings of parameters (step S210).

Figure 12:
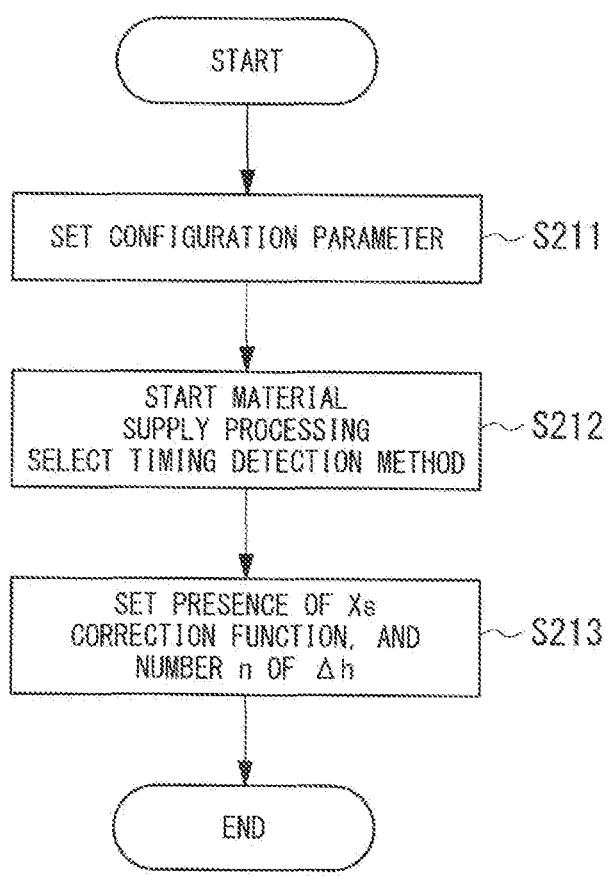
FIG. 12 is a view showing a procedure of processing in step S210 of the embodiment.

Here, FIG. 12 is a view showing a procedure of processing in step S210.

In the processing of FIG. 12, first, the wire feed amount calculation unit 204 receives user settings of configuration parameters (setting of parameter values by a user) (step S211). The configuration parameters described herein are fixed numbers determined from specification of the deposition device 1 or the wire 921. The wire feed amount calculation unit 204 receives user settings of the liquid surface standard distance Xo, the standard material consumption amount Xs, the diameter A of the melting range in the crucible 140, or the diameter A of the wire 921 as the configuration parameters.

Next, the processing timing detection unit 205 receives user selection of the start timing detection method of the material supply processing (step S212). The processing timing detection unit 205 receives, for example, selection of any one of the regular material supply method and the conveyance substrate interval material supply method as the start timing detection method of the material supply processing.

In addition, the wire feed amount calculation unit 204 receives user settings on whether a regular displacement correction function (to be described below) is used as well as a setting of the number of samples of average processing when the function is used (step S213).

After that, the processing of FIG. 12 is terminated, and the process returns to the processing of FIG. 11.

After step S210, the processing timing detection unit 205 waits for the start timing of the material supply processing according to the start timing detection method of the selected material supply processing (step S221). When the start timing of the material supply processing is detected, the processing timing detection unit 205 instructs start of the material supply processing with respect to the wire feed amount calculation unit 204, and the wire feed amount calculation unit 204 calculates the total wire feed amount Xw according to the instruction (step S222). Further, specific processing in step S222 is varied according to a number of repetitions of the material supply processing or existence of use of the regular displacement correction function. More specific processing will be described below.

When the total wire feed amount Xw is computed, the wire feed amount calculation unit 204 instructs the shutter control unit 203 to open the shutter 122, and the shutter control unit 203 controls the shutter driving motor 121 to cause the shutter 122 to open according to the instruction (step S223). In addition, the wire feed amount calculation unit 204 outputs the computed total wire feed amount Xw to the wire operation control unit 201.

When the shutter 122 opens, the shutter control unit 203 instructs the wire operation start to the wire operation control unit 201, and the wire operation control unit 201 performs the wire feed operation according to the instruction. Steps S224 and S225 correspond to the processing of the wire feed operation, and as described with reference to FIG. 3, the wire operation control unit 201 controls the wire feed roller driving motor 102 to first perform a high speed feed operation (step S224), and then perform a low speed feed operation (step S225).

When the wire feed operation of the total wire feed amount Xw is terminated, the wire operation control unit 201 controls the wire feed roller driving motor 102 to perform a wire return operation (step S226). Then, the wire front end detection unit 202 detects a front end position of the wire 921 based on an optical detection circumstance of the wire front end detection sensor 110 (step S227).

Then, the wire feed amount calculation unit 204 calculates the wire length ΔXt of a correction extent based on the front end position of the wire 921 detected by the wire front end detection unit 202 (step S228). More specific contents of the processing in step S228 will be described below.

When the wire length ΔXt of the correction extent is computed, the wire feed amount calculation unit 204 instructs the shutter control unit 203 to close the shutter 122, and the shutter control unit 203 controls the shutter driving motor 121 to cause the shutter 122 to close (step S229). The processing from step S222 to step S229 corresponds to one instance of the material supply processing.

After step S229, the process returns to step S221.

Figure 13:
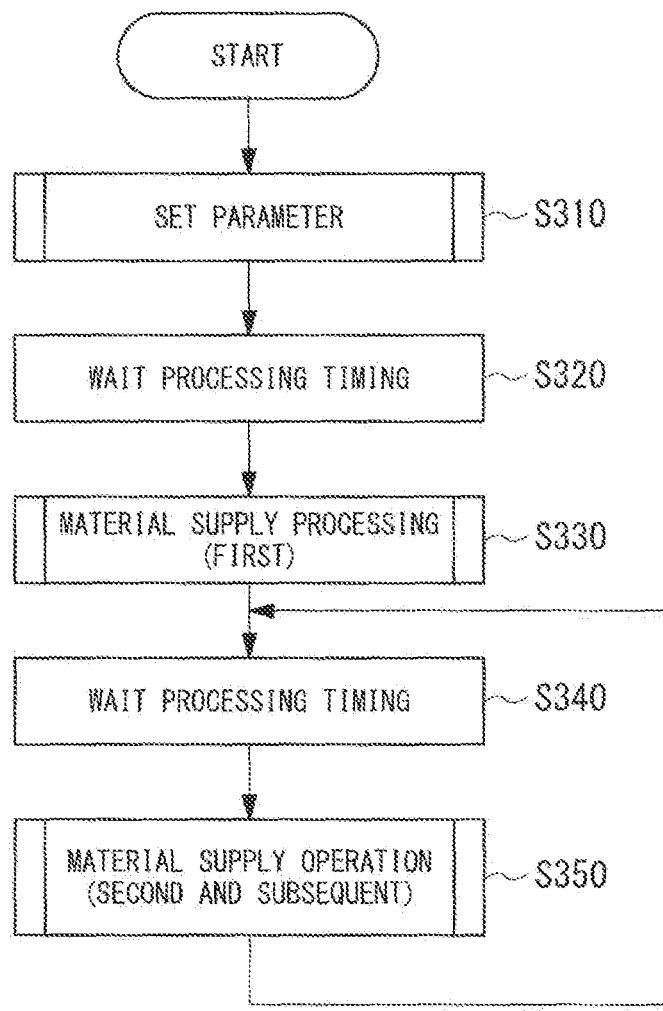
FIG. 13 is a view schematically showing the material supply processing performed by the deposition device 1 in a state in which a regular displacement correction function is set not to be used in the embodiment.

FIG. 13 is a view schematically showing the material supply processing performed by the deposition device 1 in the setting in which the regular displacement correction function is not used.

In the processing of FIG. 13, step S310 is similar to step S210 of FIG. 11. In addition, both of step S320 and step S340 are similar to step S221 of FIG. 11. In addition, both of step S330 and step S350 correspond to the material supply processing (step S222 to step S229) of FIG. 11. However, the processing of step S330 serving as the first material supply processing is different from step S350 serving as the second and subsequent material supply processing in the processing corresponding to step S222 of FIG. 11.

Figure 14:
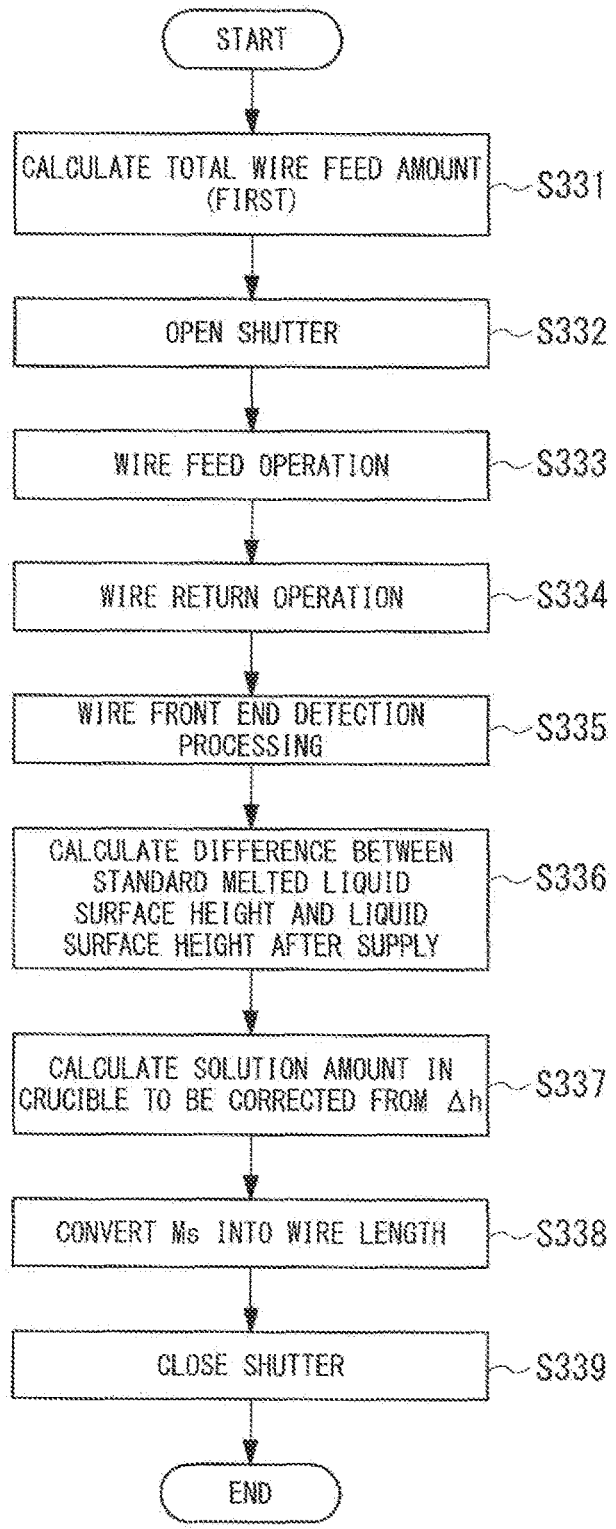
FIG. 14 is a view showing a procedure of the first material supply processing performed by the deposition device 1 in a state in which the regular displacement correction function is set not to be used in the embodiment.

FIG. 14 is a view showing a procedure of the first material supply processing performed by the deposition device 1 in the setting in which the regular displacement correction function is not used. The deposition device 1 performs processing of FIG. 14 in step S330 of FIG. 13.

In the processing of FIG. 14, the wire feed amount calculation unit 204 calculates the total wire feed amount Xw based on Equation (5) (step S331). That is, at the time of the processing of step S331, the wire 921 is still not inserted into the melted material 922 of the crucible 140, and the height of the liquid surface of the crucible 140 cannot be detected. Here, the wire feed amount calculation unit 204 calculates the total wire feed amount Xw based on the presumption that the liquid surface of the crucible 140 is disposed at the standard liquid surface position as shown in the example of FIG. 4. Step S331 corresponds to step S222 of FIG. 11.

The next step S332 is similar to step S223 of FIG. 11. In addition, step S333 is similar to steps S224 and S225 of FIG. 11. In addition, steps S334 to S335 are similar to steps S226 to S227 of FIG. 11.

After step S335, the wire feed amount calculation unit 204 calculates the difference Δh of the height of the liquid surface with respect to the standard liquid surface position using the front end position of the wire 921 detected by the wire front end detection unit 202 based on Equation (1) (step S336). Next, the ire feed amount calculation unit 204 calculates the amount Ms to be corrected with respect to the amount (volume) of the melted material 922 in the crucible 140 using the difference Δh of the computed height of the liquid surface based on Equation (2) (step S337).

Then, the wire feed amount calculation unit 204 converts the amount Ms to be corrected into the wire length ΔXt of the correction extent using the computed amount Ms to be corrected based on Equation (3) (step S338). The above-mentioned steps S336 to S338 correspond to step S228 of FIG. 11.

The next step S339 is similar to step S229 of FIG. 11.

After step S339, the processing of FIG. 14 is terminated, and the process returns to the processing of FIG. 13.

Figure 15:
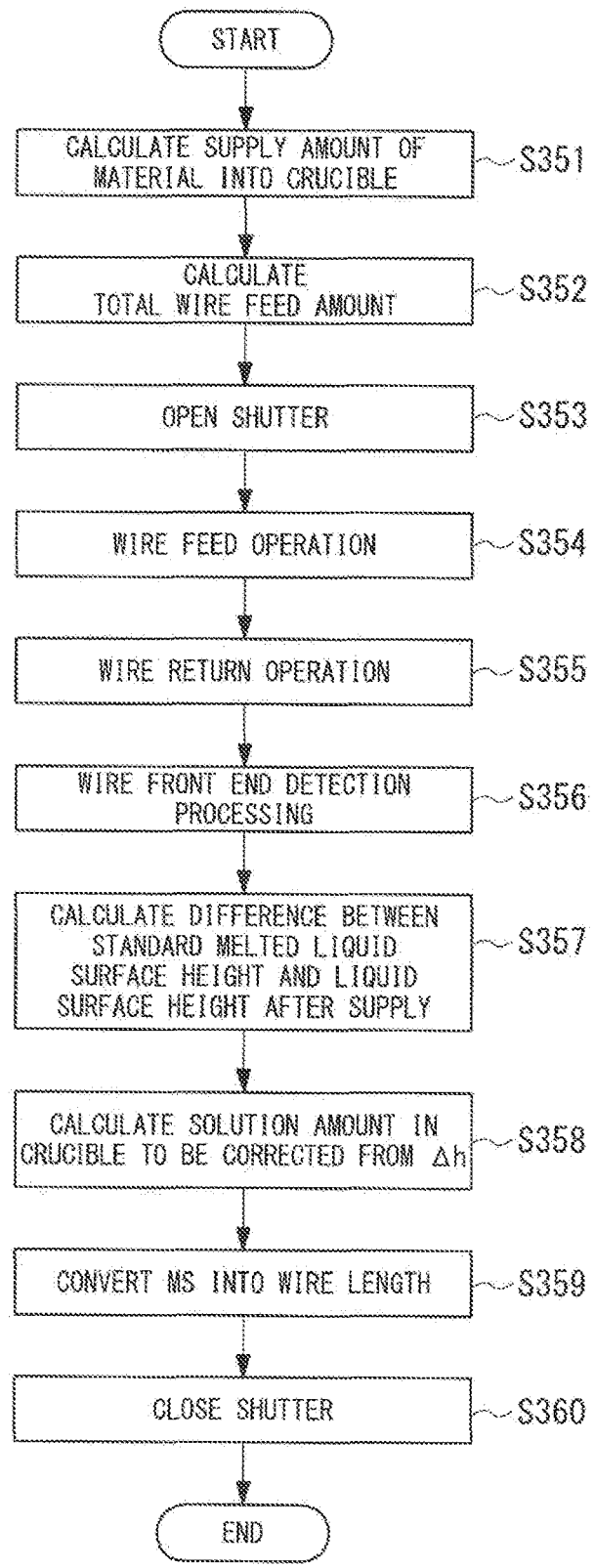
FIG. 15 is a view showing a procedure of the second and subsequent material supply processing performed by the deposition device 1 in a state in which the regular displacement correction function is set not to be used in the embodiment.

FIG. 15 is a view showing a procedure of the second and subsequent material supply processing performed by the deposition device 1 in the setting in which the regular displacement correction function is not used. The deposition device 1 performs the processing of FIG. 15 in step S350 of FIG. 13.

In the processing of FIG. 15, the wire feed amount calculation unit 204 calculates the wire length Xa to be supplied into the crucible 140 using the computed wire length ΔXt to be corrected through the last material supply processing, based on Equation (4) (step S351). Then, the wire feed amount calculation unit 204 calculates the total wire feed amount Xw using the computed wire length Xa to be supplied into the crucible 140 based on Equation (5) (step S352). In this way, the wire feed amount calculation unit 204 calculates the total wire feed amount Xw in which a detection value of the height of the liquid surface in the crucible 140 is reflected in the second and subsequent material supply processing.

Hereinafter, steps S353 to S360 are similar to steps S332 to S339 of FIG. 14. After step S360, the processing of FIG. 15 is terminated, and the process returns to the processing of FIG. 13.

Further, when the total wire feed amount Xw obtained in step S352 of FIG. 15 is equal to or less than the liquid surface standard distance Xo, two ways of processing are considered.

First, when the above-mentioned phenomenon is singly generated, while the amount of the melted material 922 in the crucible 140 is temporarily increased due to a certain cause, evaporating and reducing the material can be considered. Here, in this case, stopping the material supply processing once and waiting until the amount of the liquid decreases can be considered.

Meanwhile, when the above-mentioned phenomenon continues, the melted material 922 in the crucible 140 is considered not to be evaporating normally. Here, in this case, emitting an alarm to a user can be considered. For example, in step S352, the wire feed amount calculation unit 204 counts the consecutive number of times the total wire feed amount Xw is equal to or smaller than the liquid surface standard distance Xo. Then, when the consecutive number of times is equal to or smaller than a predetermined number of times (for example, three times), the next material supply processing is paused. Meanwhile, when the consecutive number of times exceeds the predetermined number of times, the wire feed amount calculation unit 204 emits an alarm to the user.

Figure 16:
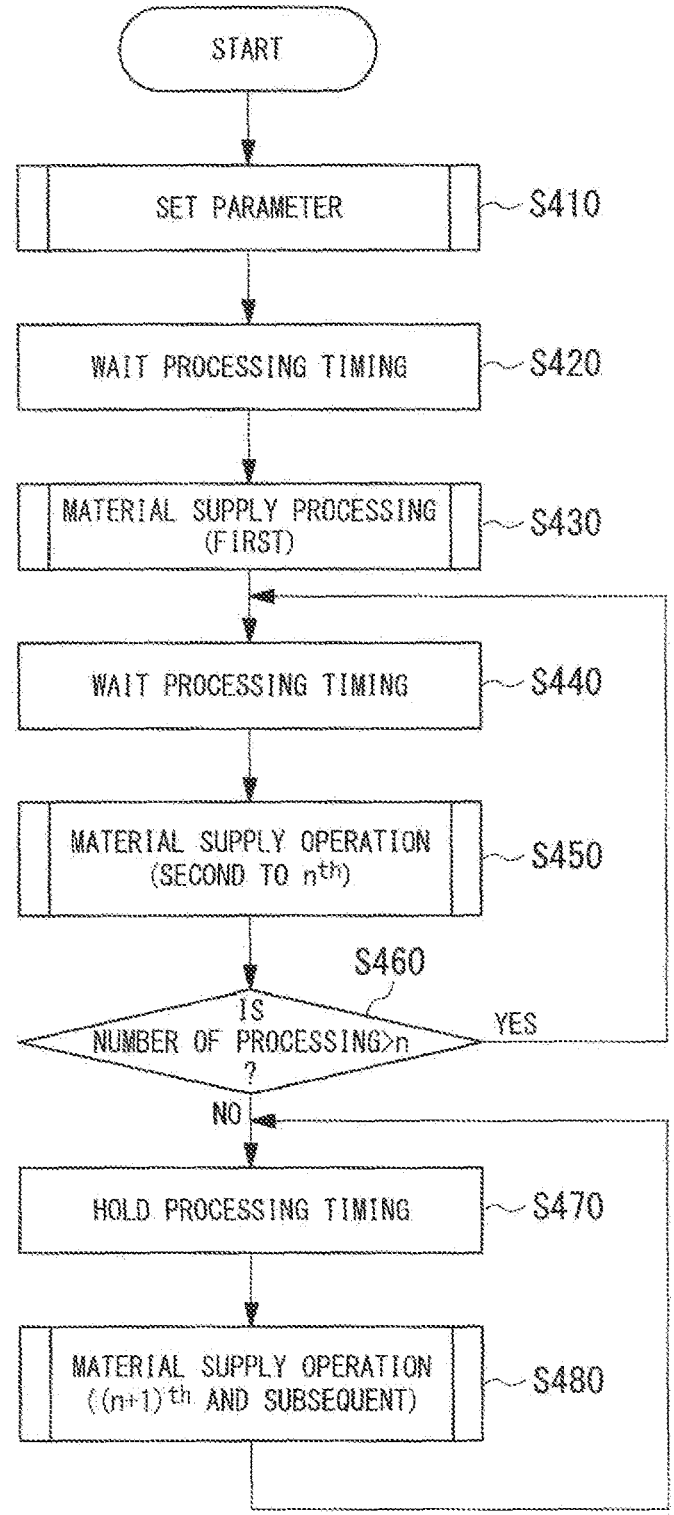
FIG. 16 is view schematically showing the material supply processing performed by the deposition device 1 in a state in which the regular displacement correction function is set to be used in the embodiment.

FIG. 16 is a view schematically showing the material supply processing performed by the deposition device 1 in the setting in which the regular displacement correction function is used.

In the processing of FIG. 16, steps S410 to S450 are similar to steps S310 to S350 of FIG. 13. In addition, step S470 is the same as step S420 or S440, and similar to step S221 of FIG. 11.

While step S480 corresponds to the material supply processing (steps S222 to S229) of FIG. 11, step S480 is different from step S430 or step S450 in the processing corresponding to step S222.

Figure 17:
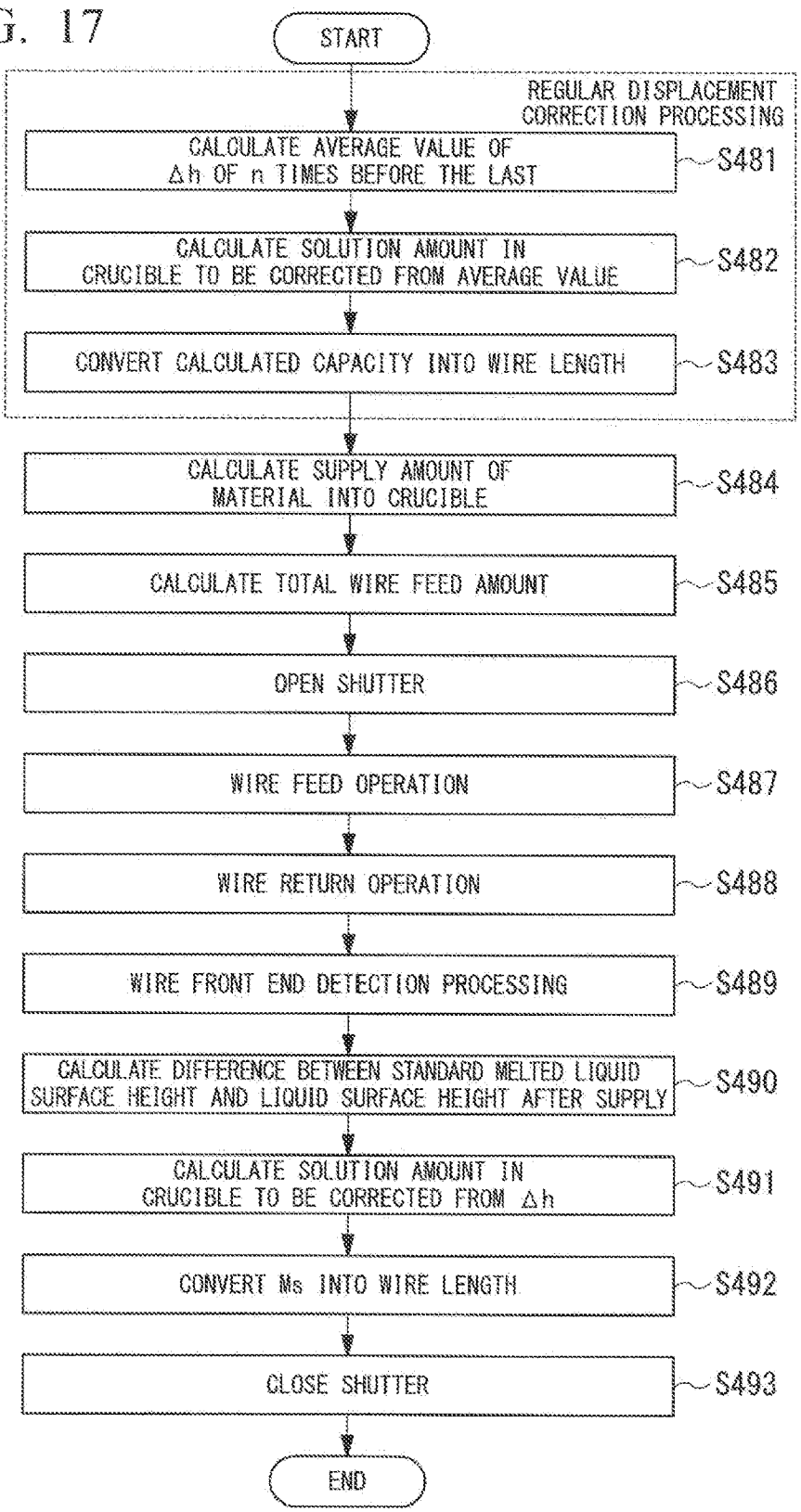
FIG. 17 view showing a procedure of the $(n+1)^{th}$ and subsequent material supply processing performed h the deposition device 1 in a state in which the regular displacement correction function is set to be used in the embodiment.

FIG. 17 is a view showing a procedure of the $(n+1)^{th}$ and subsequent material supply processing performed by the deposition device 1 in the setting in which the regular displacement correction function is used. The deposition device 1 performs the processes shown in FIG. 17 in step S480 of FIG. 16.

In the processing of FIG. 17, the wire feed amount calculation unit 204 first calculates an average $\Delta h'$ of the difference $\Delta h$ of the height of the liquid surface with respect to the standard liquid surface position in the material supply processing of n times before the last (i.e., from the last to before the $n^{th}$ time) based on Equation (9) (step S481).

[Math. 9]

$$\Delta h' = \frac{\sum_{j=i-n}^{i-1} \Delta h(i)}{n} \tag{9}$$

However, the material supply processing of this time becomes an $i^{th}$ time. In addition, $\Delta h(j)$ represents a value of $\Delta h$ in $j^{th}$ processing.

Next, the wire feed amount calculation unit 204 calculates an average value Ms' of an amount to be corrected with respect to an amount (a volume) of the melted material 922 in the crucible 140 using the computed average value $\Delta h'$ based on Equation (10) (step S482).

[Math. 10]

$$Ms' = \left(\frac{A}{2}\right)^2 \times \pi \times \Delta h' \tag{10}$$

Then, the wire feed amount calculation unit 204 converts the computed average value Ms' into a wire feed length $\Delta Xt'$ based on Equation (11) (step S483).

[Math. 11]

$$\Delta Xt' = \frac{Ms'}{\left(\frac{a}{2}\right)^2 \times \pi} \tag{11}$$

Further, the wire feed amount calculation unit 204 corrects the wire length Xs to an extent of the standard material consumption amount based on Equation (12), and calculates the wire length Xa to be supplied into the crucible 140 (step S484).

[Math. 12]

$$Xa = Xs - (\Delta Xt' + \Delta Xt) \tag{12}$$

In Equation 12), in addition to the correction in Equation (4), the average value Ms' of the amount to be corrected with respect to the amount (the volume) of the melted material 922 in the crucible 140 is subtracted from the wire length Xs to an extent of the standard material consumption amount.

Here, for example, when a normal deviation occurs in a wire length calculation value Xs to an extent of the standard consumption amount of the original standard consumption amount due to any cause such as inaccurate set values of the configuration parameters or the like, it is expected that the deviation is reflected to the average value Ms'. Accordingly, as the correction is performed based on Equation (12), deviation between the standard liquid surface position due to the normal deviation and the position of the liquid surface in the crucible 140 can be reduced.

In this respect, the processing of steps S481 to S483 is the regular displacement correction processing (the processing of obtaining a correction amount with respect to normal displacement).

The processing of steps S485 to S493 is similar to steps S352 to S360 of FIG. 14.

After step S360, the processing of FIG. 17 is terminated, and the process returns to the processing of FIG. 16.

As described above, in the melted state detection step, the melted state of the solid phase material (for example, the wire 921) after supply in the supply step is detected. Then, in the liquid surface detection step, the height of the liquid surface is detected based on the melted state. Accordingly, even when the material is not contaminated and the melted area is reduced, the height of the liquid surface can be more accurately measured. In particular, as the material having the same ingredient as the material in the melted state in the crucible is used, contamination of the material does not occur even when the material is melted. In addition, since the melted state of the material in the solid phase is detected, it can be applied even when the melted area is small. In addition, since there is no need to directly photograph the liquid surface or measure a weight of the liquid, a measurement error due to the deposition or a situation in which measurement is impossible is unlikely to occur.

In addition, for example, as a linear deposition material such as the wire 921 or the like is used as the solid phase material, the volume of the melted deposition material can be detected through the simple processing in which the length of the linear deposition material is detected.

In addition, the solid phase material (for example, the wire 921) is withdrawn to a withdrawal position deviated from the range in which the material is deposited through a withdrawal step, and in the melted state detection step, the melted state of the solid phase material is detected at the withdrawal position.

Accordingly, anxiety over the material being deposited on a sensor or the like configured to detect the melted state is reduced. In this respect, the measurement having higher accuracy can be performed, and anxiety over the measurement not being performed due to deposition is reduced.

In addition, since the front end position of the solid phase material is detected using the linear solid phase material as the material in the melted state detection step, the detection can be performed through a simple detection method using an ON/OFF sensor of light or the like.

In addition, in the suppression step, since the suppression unit configured to suppress deposition of the evaporated material on the sensor is operated, the deposition of the material on the sensor can be suppressed to prevent a further decrease in measurement accuracy.

In addition, since the height of the liquid surface is computed based on the withdrawal amount of the linear solid phase material, the height of the liquid surface can be obtained through simple measurement in which the return amount of the material is measured and the position of the front end of the material is detected.

In addition, in the melted state detection step, the melted state of the solid phase material (for example, the wire 921) after supply in the supply step is detected.

As the height of the liquid surface is more accurately measured based on the melted state, the height of the liquid surface is constantly maintained, and film formation for a long period of time becomes possible with more stable film thickness distribution and film formation speed.

Further, each of the above-mentioned equations is an example according to a shape of the crucible according to the embodiment or a shape of the deposition material in the solid phase, and the present invention is not limited thereto.

Further, the suppression unit according to the embodiment of the present invention is not limited to the above-mentioned shutter 122, and movement of the material evaporated through heating by the electron beam device 130 to the wire front end detection sensor 110 may be suppressed. For example, the wire guide nozzle 106 is fixed in the state shown in FIG. 1, and the deposition device 1 may include a lid serving as the suppression unit installed at the front end of the wire guide nozzle 106 to be opened/closed.

Further, the deposition device according to the embodiment of the present invention may not include the control unit. More specifically, when the melted state detection unit (for example, the wire front end detection sensor 110) receives an influence of the deposition upon detection of the melted state (for example, the front end position of the wire 921), the deposition device may not include the suppression unit.

As an example of the case in which an influence of deposition when the wire front end detection sensor 110 serving as an example of the melted state detection unit detects the front end position of the wire 921, the ease in which the wire front end detection sensor 110 mechanically detects the front end position of the wire 921 is provided. More specifically, as described above, the case in which the wire front end detection sensor 110 includes a switch lowered by the wire 921 and the front end of the wire 921 is disposed at the position at which the switch is installed at the timing through ON/OFF switching of the switch is provided.

Hereinabove, while an embodiment of the present invention has been described with reference to the accompanying drawings, a specific configuration is not limited to the embodiment hut may include design changes or the like without departing from the spirit of the present invention.

INDUSTRIAL APPLICABILITY

The present invention relates to a method for supplying a deposition material including a heating step of heating and evaporating a deposition material accommodated in a material accommodating section in which the deposition material is accommodated, a supply step of supplying the deposition material into the material accommodating section by feeding and melting the deposition material in a solid phase toward the deposition material melted in the material accommodating section, and a melted state detection step of detecting a melted state of the deposition material in the solid phase after supply in the supply step.

According to the present invention, even when the material is not contaminated and the melted area is reduced, the height of the liquid surface can be more accurately measured.

REFERENCE SIGNS LIST 1 deposition device
100 supply unit
101 wire drum
102 wire feed roller driving motor
103 rotary shall
104 gear
105 wire feed roller
106 wire guide nozzle
110 wire front end detection sensor
121 shutter driving motor
122 shutter
130 electron beam device
140 crucible
200 control device
201 wire operation control unit
202 wire front end detection unit
203 shutter control unit
204 wire feed amount calculation unit
205 processing timing detection unit

The invention claimed is:
1. A method for supplying a deposition material, the method comprising:
 a heating step of heating and evaporating a deposition material in a melted state in a material accommodating section;

a supply step of supplying the deposition material into the material accommodating section by inserting a deposition material in a solid phase into the deposition material in the melted state in the material accommodating section and melting the inserted deposition material in a solid phase;

step of returning the deposition material to the solid phase;

a melted state detection step of detecting a front end position of the deposition material in the solid phase at a timing in an operation of returning the deposition material in a solid phase after supply in the supply step; and a liquid surface detection step of detecting a height of a liquid surface of the deposition material in the material accommodating section based on a return amount of the deposition material in the solid phase at the timing, wherein, in the supply step, the deposition material in the solid phase of an amount according to the detection result in the liquid surface detection step is fed toward the melted deposition material in the material accommodating section, and the supply step and the step of returning the material to the solid phase are performed before a substance on which deposition is to be performed arrives at a deposition region where a deposition material is evaporated.

2. The method for supplying the deposition material according to claim 1, wherein, in the supply step, the deposition material in the solid phase having the same ingredient as the deposition material in the melted state in the material accommodating section is inserted.

3. The method for supplying the deposition material according to claim 1, wherein the deposition material in the solid phase is linear, in the melted state detection step, a front end position of the deposition material in the solid phase after melting in the supply step is detected.

4. The method for supplying the deposition material according to claim 1, wherein the deposition material in the solid phase is linear, and the method further comprises:

a volume computation step of computing a volume of the deposition material to be supplied into the material accommodating section based on the height of the liquid surface detected in the liquid surface detection step; and a length computation step of converting the volume of the deposition material to be supplied into the material accommodating section into a length of the deposition material in the solid phase, wherein, in the supply step, the deposition material in the solid phase of the length computed in the length computation step is fed into the melted deposition material in the material accommodating section.

5. The method for supplying the deposition material according to claim 1, wherein the deposition material in the solid phase is linear.

6. The method for supplying the deposition material according to claim 1, further comprising: a withdrawal step of withdrawing the deposition material in the solid phase to a withdrawal position deviated from a range in which the deposition material evaporated from the material accommodating section is deposited, wherein, in the melted state detection step, the front end position of the deposition material in the solid phase is detected at the withdrawal position.

7. The method for supplying the deposition material according to claim 1, wherein the deposition material in the solid phase is linear, in the step of returning the material to the solid phase, the deposition material in the solid phase being withdrawn to a withdrawal position deviated from a range in which the deposition material evaporated from the material accommodating section is deposited, in the melted state detection step, the front end position of the deposition material in the solid phase is detected at the withdrawal position, and in the liquid surface detection step, the height of the liquid surface is computed based on a detection result in the melted state detection step and a withdrawal amount at which the deposition material in the solid phase is withdrawn to the withdrawal position in the withdrawal step.

8. A method for producing a substrate using the method for supplying the deposition material according to claim 1.

9. A control device for controlling a deposition device configured to supply a deposition material into a material accommodating section by heating and evaporating the deposition material in a melted state while the deposition material is accommodated in the material accommodating section, and inserting the deposition material in a solid phase into the deposition material in the melted state in the material accommodating section and melting the inserted deposition material in a solid phase, the control device comprising:

a liquid surface detection unit configured to detect a height of a liquid surface of the deposition material in the material accommodating section based on a return amount of the deposition material in the solid phase at a timing when the deposition device detects a front end position of the deposition material in the solid phase, wherein the deposition device feeds and melts the deposition material in the solid phase toward the deposition material in the melted state in the material accommodating section and thereafter the deposition device returns the remaining deposition material in the solid phase, and the deposition device detects the front end position when the deposition device returns the remaining deposition material in the solid phase; and a deposition material feed control unit configured to compute a volume of the deposition material to be supplied into the material accommodating section, and control the deposition device to feed the deposition material such that the deposition material in the solid phase to an extent of the computed volume is fed toward the melted deposition material in the material accommodating section, based on a detection result of the liquid surface detection unit, wherein the deposition material feed control unit controls the deposition device to insert and melt the deposition material in the solid phase toward the deposition material in the melted state in the material accommodating section and return the remaining deposition material to the solid phase before a substance on which deposition is to be performed arrives at a deposition region where a deposition material is evaporated.

10. A deposition device comprising:

a material accommodating section;

a heating unit configured to heat and evaporate a deposition material in a melted state while the deposition material is accommodated in the material accommodating section;

a supply unit configured to supply the deposition material in the material accommodating section by inserting a deposition material in a solid phase into the deposition material in the melted state in the material accommodating section and melting the inserted deposition material in a solid phase;

a melted state detection unit configured to detect a front end position of the deposition material in the solid phase at a timing in an operation of returning the deposition material in the solid phase after the supply unit supplies the deposition material into the material accommodating section; and a liquid surface detection unit configured to detect a height of a liquid surface of the deposition material in the material accommodating section based on a return amount of the deposition material at the timing, wherein the supply unit feeds the deposition material in the solid phase of an amount according to the detection result of the liquid surface detection unit toward the melted deposition material in the material accommodating section, and the supply unit inserts and melts the deposition material in the solid phase toward the deposition material in the melted state in the material accommodating section and returns the remaining deposition material to the solid phase before a substance on which deposition is to be performed arrives at a deposition region where a deposition material is evaporated.

* * * * *